(12) United States Patent
Iwasaki

(10) Patent No.: US 7,935,582 B2
(45) Date of Patent: May 3, 2011

(54) FIELD EFFECT TRANSISTOR USING AMORPHOUS OXIDE FILM AS CHANNEL LAYER, MANUFACTURING METHOD OF FIELD EFFECT TRANSISTOR USING AMORPHOUS OXIDE FILM AS CHANNEL LAYER, AND MANUFACTURING METHOD OF AMORPHOUS OXIDE FILM

(75) Inventor: Tatsuya Iwasaki, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/833,850

(22) Filed: Jul. 9, 2010

(65) Prior Publication Data

US 2010/0279462 A1 Nov. 4, 2010

Related U.S. Application Data

(62) Division of application No. 11/993,456, filed as application No. PCT/JP2006/317936 on Sep. 5, 2006, now Pat. No. 7,791,074.

(30) Foreign Application Priority Data

Sep. 6, 2005 (JP) .................................. 2005-258263
Aug. 15, 2006 (JP) .................................. 2006-221552

(51) Int. Cl.
*H01L 29/786* (2006.01)

(52) U.S. Cl. ............ 438/151; 438/104; 257/52; 257/55; 257/57; 257/66; 257/72; 257/79; 257/98; 257/E21.441; 257/E21.46; 257/E21.461; 257/E29.145; 257/E29.273; 257/E29.299

(58) Field of Classification Search .................... 257/52, 257/55, 57, 66, 72, 79, 98, E21.441, E21.46, 257/E21.461, E29.145, E29.273, E29.299; 438/104, 151

See application file for complete search history.

(56) References Cited

U.S. PATENT DOCUMENTS

| | | | |
|---|---|---|---|
| 5,744,864 A | 4/1998 | Cillessen et al. |
| 6,476,409 B2 | 11/2002 | Iwasaki et al. |
| 6,784,007 B2 | 8/2004 | Iwasaki et al. |
| 7,067,843 B2 | 6/2006 | Carcia et al. |

(Continued)

FOREIGN PATENT DOCUMENTS

JP 8-264794 10/1996

(Continued)

OTHER PUBLICATIONS

N. L. Dehuff, et al., "Transparent thin-film transistors with zinc indium oxide channel layer", Journal of Applied Physics, vol. 97, 2005, pp. 064505-1-064505-5.

(Continued)

*Primary Examiner* — Dao H Nguyen

(74) *Attorney, Agent, or Firm* — Fitzpatrick, Cella, Harper & Scinto

(57) ABSTRACT

An amorphous oxide containing hydrogen (or deuterium) is applied to a channel layer of a transistor. Accordingly, a thin film transistor having superior TFT properties can be realized, the superior TFT properties including a small hysteresis, normally OFF operation, a high ON/OFF ratio, a high saturated current, and the like. Furthermore, as a method for manufacturing a channel layer made of an amorphous oxide, film formation is performed in an atmosphere containing a hydrogen gas and an oxygen gas, so that the carrier concentration of the amorphous oxide can be controlled.

4 Claims, 5 Drawing Sheets

U.S. PATENT DOCUMENTS

| | | | |
|---|---|---|---|
| 7,145,174 B2 | 12/2006 | Chiang et al. | |
| 7,189,992 B2 * | 3/2007 | Wager et al. | 257/43 |
| 7,242,039 B2 | 7/2007 | Hoffman et al. | |
| 7,319,069 B2 | 1/2008 | Den et al. | |
| 7,453,087 B2 | 11/2008 | Iwasaki | |
| 7,547,591 B2 * | 6/2009 | Hoffman et al. | 438/151 |
| 7,626,201 B2 | 12/2009 | Chiang et al. | |
| 7,791,074 B2 * | 9/2010 | Iwasaki | 257/59 |
| 2001/0041396 A1 * | 11/2001 | Yamazaki et al. | 438/151 |
| 2005/0017244 A1 | 1/2005 | Hoffman et al. | |
| 2006/0110867 A1 | 5/2006 | Yabuta et al. | |
| 2006/0244107 A1 | 11/2006 | Sugihara et al. | |
| 2007/0023750 A1 * | 2/2007 | Chiang et al. | 257/43 |
| 2007/0102709 A1 * | 5/2007 | Burgener et al. | 257/78 |
| 2008/0073653 A1 | 3/2008 | Iwasaki | |
| 2009/0242892 A1 * | 10/2009 | Teramoto | 257/66 |

FOREIGN PATENT DOCUMENTS

| | | |
|---|---|---|
| JP | 2001-131741 | 5/2001 |
| JP | 2003-7716 | 1/2003 |
| JP | 2005-33172 | 2/2005 |
| WO | 2004/114391 | 12/2004 |
| WO | 2005/015643 A1 | 2/2005 |
| WO | 2005/093848 | 10/2005 |

OTHER PUBLICATIONS

Kenji Nomura, et al., "Room-temperature fabrication of transparent flexible thin-film transistors using amorphous oxide semiconductors", Nature, vol. 432, Nov. 25, 2004, pp. 488-492.

* cited by examiner

FIELD EFFECT TRANSISTOR USING AMORPHOUS OXIDE FILM AS CHANNEL LAYER, MANUFACTURING METHOD OF FIELD EFFECT TRANSISTOR USING AMORPHOUS OXIDE FILM AS CHANNEL LAYER, AND MANUFACTURING METHOD OF AMORPHOUS OXIDE FILM

This application is a divisional of application Ser. No. 11/993,456, which was the National Stage of International Application No. PCT/JP2006/317936, filed Sep. 5, 2006. The contents of each of the foregoing applications is incorporated herein by reference.

TECHNICAL FIELD

The present invention relates to a field effect transistor which has a channel layer formed from an amorphous oxide and which has transistor properties applicable to a display device and the like.

BACKGROUND ART

A field effect transistor (hereinafter referred to as "FET" in some cases) has a gate electrode, a source electrode, and a drain electrode. In addition, the field effect transistor is an active device in which current flowing in the channel layer, that is, current flowing between the source and the drain electrodes is controlled by applying a voltage to the gate electrode. In particular, an FET using a thin film formed on an insulating substrate of a ceramic, a glass, or a plastic as a channel layer is called a thin film transistor (hereinafter referred to as "TFT" in some cases).

The TFT can be advantageously easily formed on a relatively large substrate by using techniques to form thin films, and as a result, the TFT has been widely used as a switching device and driver device of a flat panel display such as a liquid crystal display. That is, in an active matrix liquid crystal display (ALCD), ON/OFF operation of each image pixel is performed using a corresponding TFT formed on a glass substrate. In addition, in high-performance organic LED display (OLED), effective control of the pixel current is expected to be performed by a TFT. Furthermore, a liquid crystal display device having higher performance has been realized in which driver circuits composed of TFTs are formed on a substrate in a peripheral region of an image region.

The most widely used TFT in these days uses a polycrystalline silicon film or an amorphous silicon film as a channel layer material. The TFT described above is called a metal-insulator-semiconductor field effect transistor (MIS-FET). For a pixel driver, an amorphous silicon TFT is used, and for peripheral circuits of driver and controller, a high-performance polycrystalline silicon TFT has been practically used.

However, in TFTs including an amorphous silicon TFT and a polycrystalline silicon TFT which have been developed heretofore, high temperature processes are required for device formation, and hence it has been difficult to form the TFT on a substrate such as a plastic plate or film.

On the other hand, in recent years, development to realize flexible display has been actively performed by forming TFTs on a polymer plate or film as drive circuits of LCD or OLED. As a material which can be formed on a plastic film or the like, an organic semiconductor film has drawn attention which can be formed at a low temperature.

For example, as an organic semiconductor film, research and development of pentacene and the like has been implemented. The organic semiconductors mentioned above all have aromatic rings, and when they are crystallized, a high carrier mobility can be obtained in the lamination direction of aromatic rings. For example, it has been reported that when pentacene is used for an active layer, the carrier mobility is approximately 0.5 cm (Vs)$^{-1}$ and is approximately equivalent to that of an amorphous Si-MOSFET.

However, the organic semiconductors such as pentacene disadvantageously have inferior heat stability (<150° C.) and toxicity (oncogenic properties), and hence practical devices have not been realized as of today.

In addition, in recent years, as a material which can be applied to a channel layer of the TFT, oxide materials have begun to draw attention.

For example, development of TFT has been actively pursued which uses a transparent and conductive polycrystalline oxide thin film primarily composed of ZnO as a channel layer. The above thin film can be formed at a relatively low temperature and hence can be formed on a substrate such as a plastic plate or film. However, since a compound primarily composed of ZnO cannot be formed into a stable amorphous phase at room temperature but is formed into a polycrystalline phase, the electron mobility cannot be increased due to scattering at interfaces of polycrystalline grains. In addition, since the shape of polycrystalline grains and connection therebetween are significantly changed by film-forming methods, the properties of TFTs are scattered.

Recently, a thin film transistor has been reported in which an amorphous In—Ga—Zn—O-based oxide is used (K. Nomura et al, Nature Vol. 432, p. 488 to 492, November 2004). This transistor can be formed on a plastic or a glass substrate at room temperature. In addition, at a field-effect mobility of approximately 6 to 9, normally-off type transistor properties can be obtained. Furthermore, this transistor is advantageously transparent to visible light.

When the inventors of the present invention investigated a thin film transistor using an amorphous In—Ga—Zn—O-based oxide, although depending on the composition and manufacturing conditions, the hysteresis of transistor properties (Id-Vg properties) of TFT was generated in some cases.

When the above TFT is used, for example, for a pixel circuit of a display device, the generation of the hysteresis as described above causes variation in operation of organic LED, liquid crystal, or the like which is to be driven, and as a result, the image quality of the display device is degraded.

DISCLOSURE OF THE INVENTION

According to the present invention, the above hysteresis is reduced by appropriately designing an oxide material which is to be used for a channel of a transistor.

In addition, when an amorphous oxide material is used for a channel layer of a TFT, the electron carrier concentration is set in a desired range (such as in the range of approximately $10^{14}$ to $10^{18}$/cm$^3$). Furthermore, in order to ensure both reproducibility and uniformity of transistor properties, control means for accurately controlling the electron carrier concentration is provided.

In addition, by appropriately designing a method for forming an oxide material to be used for a channel of a transistor, the present invention also provides a method for forming a thin film having a desired electron carrier concentration with good control.

A field effect transistor according to one aspect of the present invention, comprises a channel layer including an amorphous oxide film, and the amorphous oxide film contains hydrogen or deuterium.

Above all, the concentration of the hydrogen or deuterium contained in the amorphous oxide film is set in the range of $10^{16}$ to $10^{20}/cm^3$ or is set in the range of $10^{17}$ to $10^{19}/cm^3$.

Furthermore, the composition of the amorphous oxide film containing hydrogen or deuterium is represented by the following equation that excludes the hydrogen: $[(Sn_{1-x}M4_x)O_2]_a \cdot [(In_{1-y}M3_y)_2O_3]b \cdot [Zn_{1-z}M2_zO]c$, where $0 \leq x \leq 1$, $0 \leq y \leq 1$, $0 \leq z \leq 1$, $0 \leq a < 1$, $0 \leq b < 1$, $0 \leq c < 1$, and $a+b+c=1$ hold, M4 is an element (Si, Ge, or Zr) of Group IV having an atomic number smaller than that of Sn, M3 is Lu or an element (B, Al, Ga, or Y) of Group III having an atomic number smaller than that of In, and M2 is an element (Mg or Ca) of Group II having an atomic number smaller than that of Zn. In particular, M3 comprises Ga.

In addition, in accordance with another aspect of the present invention, there is provided a method for manufacturing an amorphous oxide film which is used as a channel layer of a field effect transistor, the method comprising the steps of: disposing a substrate in an film-forming apparatus; and forming the amorphous oxide film on the substrate while an oxygen gas and a gas (other than water vapor) containing hydrogen atoms are introduced in the film-forming apparatus at respective predetermined partial pressures.

In particular, the film forming method is performed by a sputtering method, and the oxygen partial pressure during the film formation is set to 0.01 Pa or more.

Furthermore, in accordance with another aspect of the present invention, there is provided a manufacturing apparatus for manufacturing an amorphous oxide film which is formed on a substrate and which is used as a channel layer of a field effect transistor, the apparatus comprising: a film-forming chamber; evacuation means for evacuating the inside of the film-forming chamber; substrate holding means for holding the substrate in the film-forming chamber; a material source disposed to face the substrate holding means, an energy source for evaporating a material of the material source; means for supplying a hydrogen gas in the film-forming chamber; and means for supplying an oxygen gas in the film-forming chamber.

Further features of the present invention will become apparent from the following description of exemplary embodiments with reference to the attached drawings.

BEST MODE FOR CARRYING OUT THE INVENTION

Hereinafter, embodiments of the present invention will be described in detail with reference to the attached drawings.

Figure 1A:
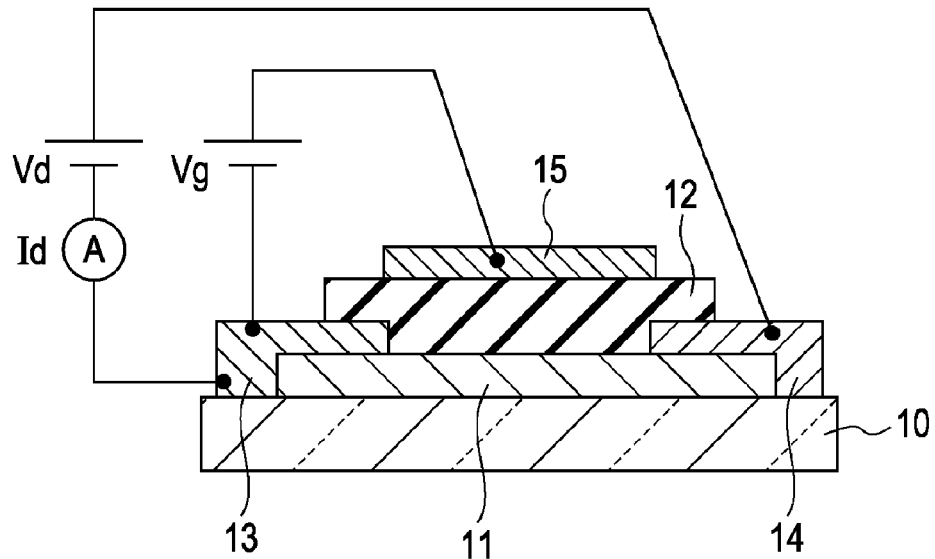
FIG. 1A is a cross-sectional view of a thin film transistor having a top gate structure according to the present invention.
Figure 1B:
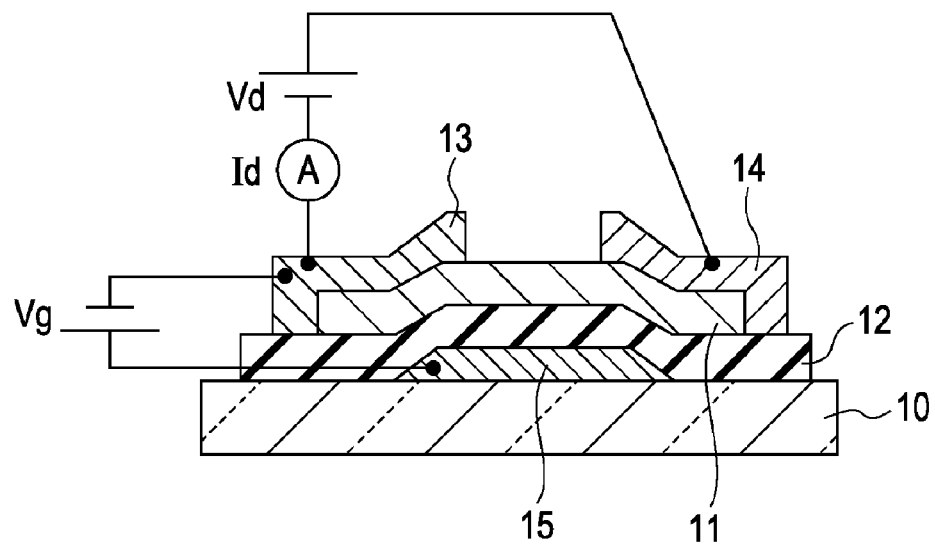
FIG. 1B is a cross-sectional view of a thin film transistor having a bottom gate structure according to the present invention.

FIGS. 1A and 1B are cross-sectional views each showing an embodiment of a thin film transistor, that is, a thin film field effect transistor, according to the present invention. FIG. 1A is a cross-sectional view showing a top gate structure in which a gate insulating film 12 and a gate electrode 15 are formed in that order on a semiconductor channel layer 11. FIG. 1B is a cross-sectional showing a bottom gate structure in which the gate insulating film 12 and the semiconductor channel layer 11 are formed in that order on the gate electrode 15. From the positional relationship of the electrode and the interface between the channel layer and the insulating film, the structure shown in FIG. 1A is called a stagger structure, and that shown in FIG. 1B is called an inverted stagger structure.

As shown in FIG. 1A, on the semiconductor channel layer 11 formed on a substrate 10, a source electrode 13, a drain electrode 14, the gate insulating film 12, the gate electrode 15 are sequentially formed, so that a field effect transistor having a top gate structure (stagger structure) is formed. In addition, as shown in FIG. 1B, on the gate electrode 15 formed on the substrate 10, the gate insulating film 12, the semiconductor channel layer 11, the source electrode 13, and the drain electrode 14 are sequentially formed, so that a field effect transistor having a bottom gate structure (inverted stagger structure) is formed.

The field effect transistors shown in FIGS. 1A and 1B are each a three terminal device having the gate electrode 15, the source electrode 13, and the drain electrode 14. The above field effect transistor is an active device having a function in which a current Id flowing through the channel layer, that is, between the source electrode and the drain electrode, is controlled by applying a voltage Vg to the gate electrode.

In the present invention, the TFT structure is not limited to the above structures, and any top gate or bottom gate structure, i.e., any stagger or inverted stagger structure, may also be used.

Figure 2A:
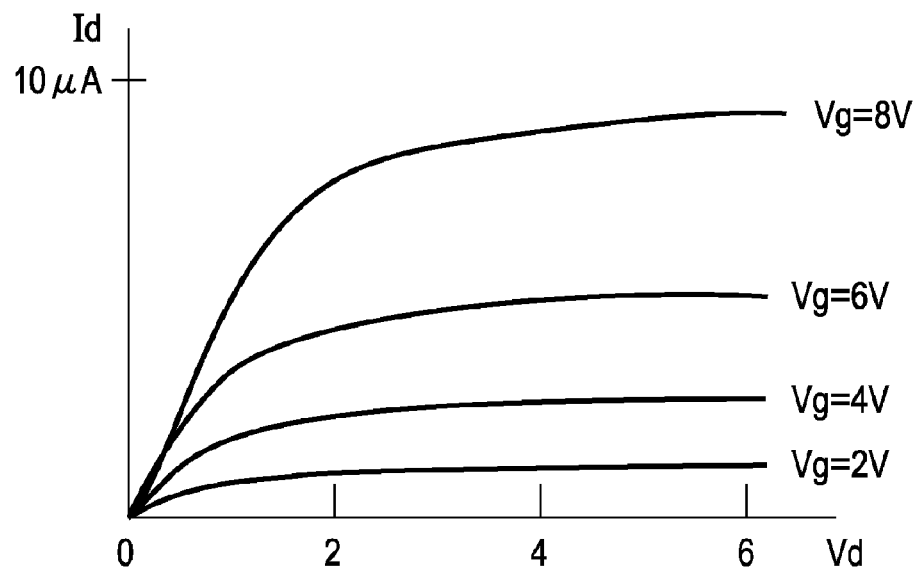
FIG. 2A is a graph showing transistor properties of a thin film transistor according to the present invention.
Figure 2B:
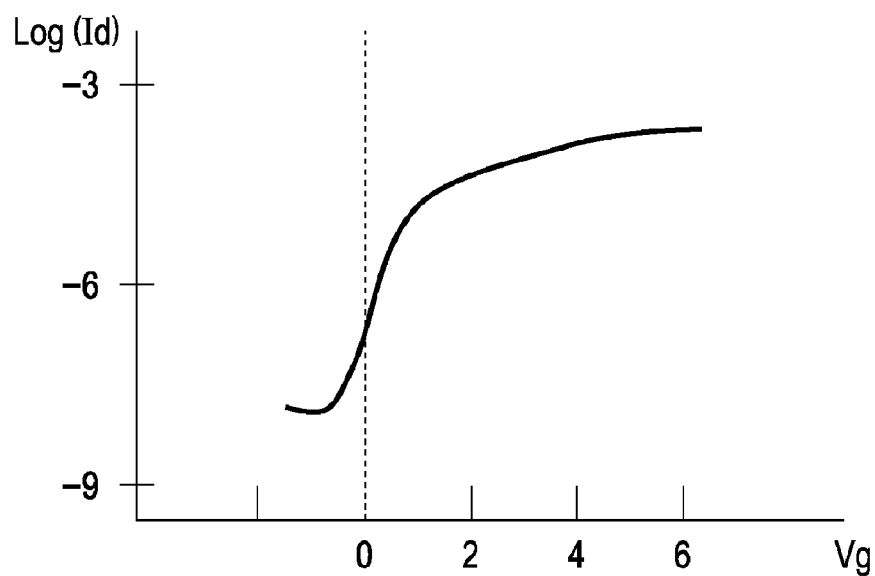
FIG. 2B is a graph showing a transfer property of a thin film transistor according to the present invention.

FIGS. 2A and 2B show typical properties of a field effect transistor (TFT) of the present invention. The properties of TFT are obtained from a field effect transistor which has the structure to be described in Example 1 and which is formed by a manufacturing method described therein. When a voltage Vd of approximately 5 V is applied between the source and drain electrodes, and when the gate voltage Vg is turned on and off between 0 to 5 V, the current Id flowing between the source and the drain electrodes can be controlled (between ON and OFF). FIG. 2A shows the Id-Vd property at various Vg values, and FIG. 2B shows the Id-Vg property (transfer property) at a voltage Vd of 6 V.

The channel layer of the TFT of this embodiment is formed of an amorphous oxide film containing hydrogen or deuterium.

Figure 3A:
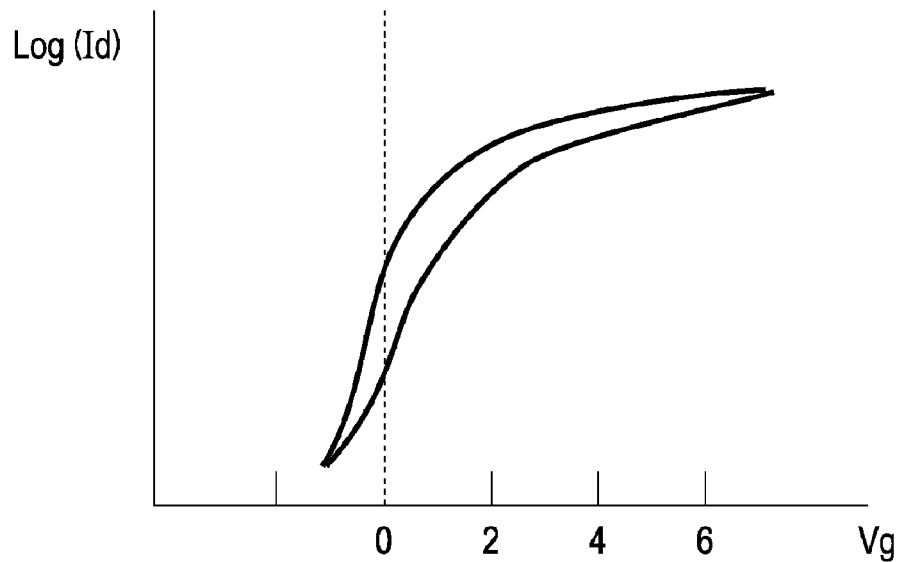
FIG. 3A is a graph showing hysteresis properties of a thin film transistor according to a comparative example.
Figure 3B:
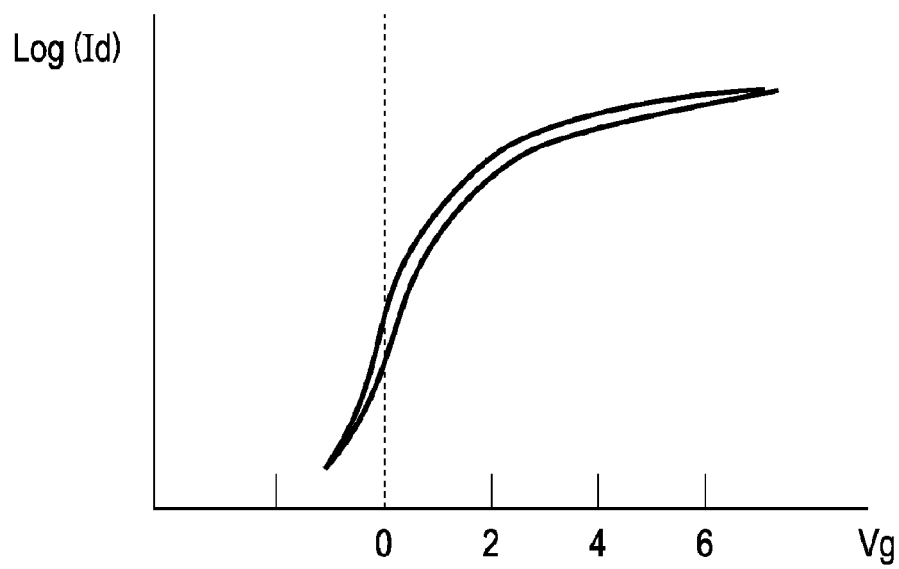
FIG. 3B is a graph showing hysteresis properties of a thin film transistor according to an example of the present invention.

With reference to FIGS. 3A and 3B, an effect obtained by addition of hydrogen to the channel layer, that is, the reduction in hysteresis, will be described. FIGS. 3A and 3B show the TFT transistor properties obtained in comparative Example 1 and Example 1, respectively. That is, in Example 1, hydrogen was added to the channel layer, and in Comparative Example 1, hydrogen was not added to the channel layer.

The hysteresis means that, for example, when Vg is swept (upward and downward) while Vd is fixed for evaluation of the TFT transfer property, the value of Id is different by upward sweep and downward sweep as shown in FIG. 3A. The hysteresis is large, when the Id value largely varies between upward sweep and downward seep at a predetermined Vg; hence, a device having a small hysteresis is preferred to control Id precisely.

When hydrogen is not contained, the hysteresis properties are as shown in FIG. 3A, and when the channel layer containing hydrogen according to the present invention is used, a device having a small hysteresis as shown in FIG. 3B can be obtained.

The reason why the hysteresis is reduced when an oxide containing hydrogen is applied to the channel layer has not been clearly understood from a physical point of view. One estimated reason is that local structural disorder in an amorphous thin film is relaxed by addition of hydrogen, and as a result, an amorphous structure is realized in which carriers are not likely to be trapped (The number of deep traps decreases). In addition, it may also be construed that the structural disorder at the interface between the channel layer and insulating film is decreased by addition of hydrogen to the channel layer and that as a result, an interface is realized between the channel layer and insulating film in which carriers are not likely to be trapped.

For the evaluation of hysteresis, Id (source drain current) is measured by sweeping (upward and downward) a gate voltage Vg in the range of −10 to 30 v while a source-drain voltage Vd is fixed at an appropriate value between 5 to 30 v. In this measurement, a voltage at which the transistor properties are in a saturated region is regarded as Vd, and Vg is swept between the ON and the OFF states. However, since the values of Vg and Vd may be determined depending on the transistor properties and the transistor structure, Vg and Vd are not always limited to the above ranges.

The size of hysteresis may be evaluated by the difference between an upward-sweep Id-Vg curve and a downward-sweep Id-Vg curve. For example, the area of a loop obtained from the upward-sweep Id-Vg curve and the downward-sweep Id-Vg curve may be used for this evaluation. When the area is small, it can be said that the hysteresis is small. In addition, the size of hysteresis may be evaluated using the difference, $\Delta Vt=|Vtu-Vtd|$, where Vtu is a threshold voltage estimated from the upward-sweep Id-Vg curve and Vtd is a threshold voltage estimated from the downward-sweep Id-Vg curve. Hereinafter, this $\Delta Vt$ is called a threshold shift amount. A small $\Delta Vt$ indicates a small hysteresis.

By the thin-film transistor which uses an oxide containing hydrogen for its channel layer, according to the present invention, a thin-film transistor having a small $\Delta Vt$ can be realized.

Since the threshold shift amount of the thin-film transistor of the present invention depends on a device structure, channel material, evaluation condition, and the like, for example, a voltage applied to the device is preferably set to a constant value under predetermined conditions. As one evaluation example of the thin-film transistor of the present invention, evaluation may be performed using the threshold shift amount which is obtained in the case in which Vg is swept (upward and downward) in the range of −5 to 15 V at a sweeping rate of 100 mV/sec under a constant Vg of 10 V. In particular, under the above evaluation conditions, the threshold shift amount can be decreased to 2 V or less, preferably 1 V or less, and more preferably 0.5 V or less.

The degree of required hysteresis depends on application of a thin-film transistor, a circuit structure to be used, and the like. For example, for liquid crystal display and electrophoretic display application, the requirement is relatively low; however, for organic EL display devices, arithmetic circuits, and the like, a higher degree (smaller hysteresis) is required. For example, for organic EL display device application, the threshold shift amount is preferably 2 V or less and more preferably 1 V or less. Furthermore, for a higher performance organic EL display device, the threshold shift amount is preferably 0.5 V or less.

(Hydrogen Concentration and Electron Carrier Concentration)

In addition, a thin film transistor having a channel layer made of an amorphous oxide was investigated. In order to obtain superior TFT properties, a semi-insulating amorphous oxide film having an electrical conductivity in the range of 0.0001 to 0.1 S/cm was favorably used as the channel layer. In order to obtain the electrical conductivity as described above, although depending on the material composition of the channel layer, an amorphous oxide film having an electron carrier concentration of approximately $10^{14}$ to $10^{18}/cm^3$ is preferably formed.

When the electrical conductivity is more than 0.1 S/cm, it becomes difficult to form a normally-off transistor, and to form a transistor having the large ON/OFF ratio. In an extreme case, even when the gate voltage is applied, the flow and the stop of current between the source and the drain electrodes cannot be controlled, and hence the transistor operation (switching) cannot be obtained.

On the other hand, when an insulating material is used, that is, when the electrical conductivity is less than 0.0001 S/cm, it becomes difficult to increase an ON current. In an extreme case, even when the gate voltage is applied, the flow and the stop of current between the source and the drain electrodes cannot be controlled, and hence the transistor operation cannot be obtained.

Figure 4:
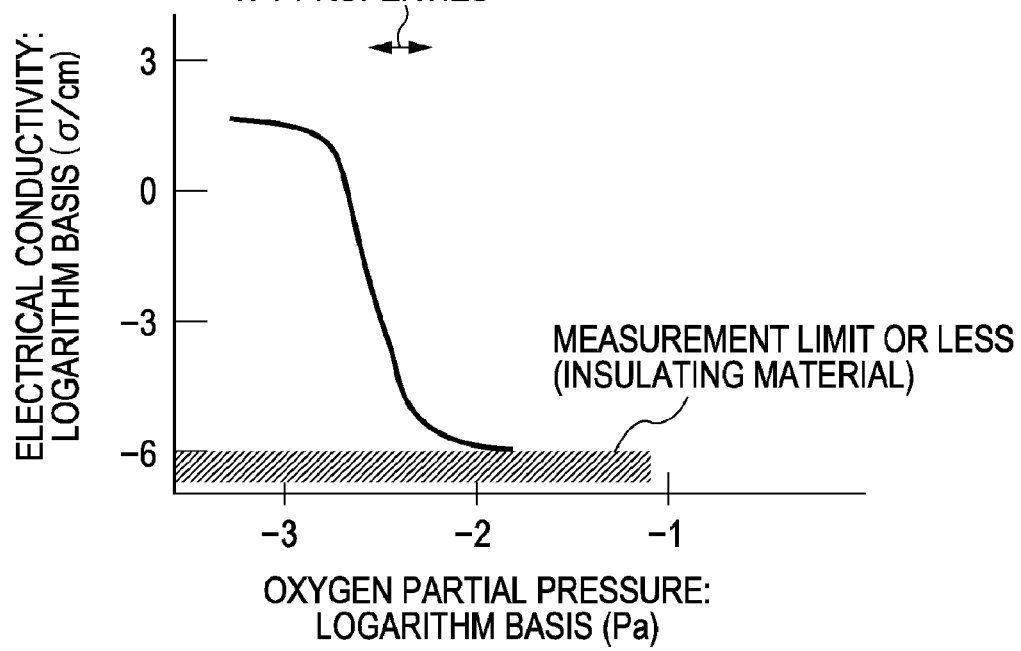
FIG. 4 is a graph showing the relationship between the electron carrier concentration of an In—Ga—Zn—O-based amorphous oxide film and the oxygen partial pressure during film formation.

In order to control the electrical conductivity and the electron carrier concentration of an oxide, the oxygen partial pressure has been controlled during film formation. That is, by controlling the oxygen partial pressure, the amount of oxygen deficiency in a thin film is primarily controlled, and the electron carrier concentration is controlled thereby. FIG. 4 is a graph showing one example of the oxygen partial pressure dependence of the carrier concentration obtained when an In—Ga—Zn—O-based oxide thin film was formed by a sputtering method. When the oxygen partial pressure is actually controlled with high accuracy, a semi-insulating amorphous oxide film is obtained which has a carrier concentration of $10^{14}$ to $10^{18}/cm^3$, and when the thin film thus obtained is applied to the channel layer, a favorable TFT can be formed. As shown in FIG. 4, when the film formation is performed typically at an oxygen partial pressure of approximately 0.005 Pa, a semi-insulating thin film can be obtained. When the partial pressure is more than 0.01 Pa, an insulating film is formed, and on the other hand, when the partial pressure is less than 0.001 Pa, a film having an excessively high electrical conductivity is formed; hence, the films thus formed are not preferably applied to the channel layer. However, as shown in FIG. 4, since the carrier concentration is very sensitively changed with the change in oxygen partial pressure, the properties are remarkably influenced by a slight change in film-formation condition, and as a result, it tends to be difficult to obtain reproducibility of TFT properties.

According to the present invention, the electron carrier concentration is controlled by addition of hydrogen (or deuterium). By intensive research carried out by the inventors of the present invention, it was found that the amount of electron carriers can be controlled by addition of hydrogen to an amorphous oxide film.

For example, in order to realize an electron carrier concentration of approximately $10^{18}/\text{cm}^3$, although depending on the oxygen partial pressure during film formation and the material composition, hydrogen may be added to have a concentration of approximately $10^{18}$ to $10^{20}/\text{cm}^3$. In this case, the control of the electron carrier concentration can be performed by the control of the amount of a hydrogen dopant. In addition, the electron carrier concentration may also be controlled by the amount of a hydrogen dopant and the amount of oxygen deficiency.

Accordingly, in order to form a TFT having superior properties, the concentration of added hydrogen is preferably controlled in the range of $10^{16}$ to $10^{20}/\text{cm}^3$. Although depending on the oxygen partial pressure and the material composition, by the addition of hydrogen described above, an oxide thin film can be realized which has an electron carrier concentration of approximately $10^{14}$ to $10^{18}/\text{cm}^3$ and which is suitably used as the channel layer of TFT.

In particular, when the hydrogen concentration is set to $10^{19}/\text{cm}^3$ or less, the normally off operation and a large ON/OFF ratio of a transistor can be realized. Furthermore, the hydrogen concentration is preferably set to $10^{17}/\text{cm}^3$ or more, and by a hydrogen concentration of $10^{17}/\text{cm}^3$ or more, the hysteresis of a transistor can be more effectively reduced.

The hydrogen concentration may be evaluated, for example, by secondary ion mass spectrometry (SIMS). Although depending on an evaluation apparatus, the detection limit is approximately $10^{17}/\text{cm}^3$. In a region of less than the detection limit, the hydrogen concentration may be indirectly obtained by extrapolation based on the assumption of the linearity between the hydrogen concentration in a thin film and the process parameter (hydrogen partial pressure or ion implantation amount during film formation which will be described later) for addition of hydrogen.

The composition components of the channel layer made of an amorphous oxide containing hydrogen of the present invention are represented by the following equation (excluding the hydrogen):

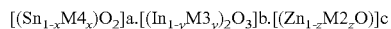

$[(Sn_{1-x}M4_x)O_2]a.[(In_{1-y}M3_y)_2O_3]b.[(Zn_{1-z}M2_z)O]c$ where $0 \leq x \leq 1$, $0 \leq y \leq 1$, $0 \leq z \leq 1$, $0 \leq a < 1$, $0 \leq b < 1$, $0 \leq c < 1$, and $a+b+c=1$ hold, M4 is an element (Si, Ge, or Zr) of Group IV having an atomic number smaller than that of Sn, M3 is Lu or an element (B, Al, Ga, or Y) of Group III having an atomic number smaller than that of In, and M2 is an element (Mg or Ca) of Group II having an atomic number smaller than that of Zn.

Among the composition components described above, in particular, the following are preferable, that is, $[(In_{1-y}Ga_y)_2O_3]b.[(ZnO)]c$, where $0 \leq y \leq 1$, $0<b<1$, and $0<c<1$ hold, and $[(SnO_2]a.[(In_2O_3]b.[(ZnO)]c$ where $0 \leq a \leq 1$, $0<b<1$, and $0<c<1$ hold.

For example, the amorphous oxide film containing hydrogen according to the present invention can be realized by the following composition. That is, the amorphous oxide film has a secondary composition or a tertiary composition located inside a triangle having three peaks of $Ga_2O_3$, $In_2O_3$, and ZnO, or has a secondary composition or a tertiary composition located inside a triangle having three peaks of $SnO_2$, $In_2O_3$, and ZnO. Some of tertiary compositions in a specific composition range may be crystallized in some cases. In particular, a primary composition is not preferable since it is crystallized. For example, of secondary compositions (compositions located on one side of the above triangle) containing two of the above three compounds, an In—Zn—O-based composition containing 20 to 70 atomic percent of In may form an amorphous film. In addition, as for a Sn—In—O-based composition, an amorphous film may be formed from a composition containing 20 to 80 atomic percent of In.

When hydrogen atoms are added to an amorphous oxide film as described in the present invention, the amorphous film can be further stabilized at room temperature. Accordingly, an amorphous oxide can be formed in a wide tertiary composition range.

(Manufacturing Method)

As a method for forming a particular amorphous oxide containing hydrogen according to the present invention, for example, there may be mentioned:

(1) a method for forming a film while a gas (except water vapor) containing hydrogen atoms is supplied in a film-forming apparatus at a predetermined partial pressure during the film formation;

(2) a method for forming a film using a material source containing hydrogen; and (3) a method for forming a film, followed by addition of hydrogen to the inside thereof by ion implantation or hydrogen plasma treatment.

Among those described above, in view of the controllability of the hydrogen concentration, the method (3) using ion implantation is preferable. However, since ion implantation is performed after the film formation, the number of steps is unfavorably increased, and the distribution of hydrogen concentration is also unfavorably generated in the film thickness direction. On the other hand, the method (2) is simple as a film forming process; however, the material source containing hydrogen cannot be easily prepared, and the hydrogen concentration in the film cannot be easily controlled. By the method (1) in which the hydrogen concentration in the film is controlled by the hydrogen partial pressure in the film-forming atmosphere, the controllability is superior, and in addition, the manufacturing process is also relatively simple. Hence, the method (1) in which the film is formed in a gas containing hydrogen is most preferably used.

As the gas containing hydrogen used in the method (1), for example, a hydrogen gas, a deuterium gas, and a hydrocarbon gas may be mentioned. In consideration of the controllability of the gas partial pressure and the safety of the gas, in particular, a hydrogen gas diluted with argon is preferably used.

In addition, as ion species used in the ion-implantation method (3), for example, $H^+$ ions, $H^-$ ions, $D^+$ ions (deuterium ions), and $H_2^+$ ions (hydrogen molecular ions) may be mentioned.

As a method for forming an amorphous oxide film, a vapor phase method such as a sputtering method (SP method), a pulse laser deposition method (PLD method), or an electron beam deposition method is preferably used. Among the vapor phase methods mentioned above, in view of mass productivity, the SP method is suitably used. However, the film forming method is not limited to those mentioned above. As for the temperature of a substrate, heating is not necessarily performed intentionally, so that the substrate can be maintained at approximately room temperature.

It has been known that when an amorphous oxide film having a low electron carrier concentration is heat-treated in a hydrogen atmosphere, the oxygen deficiency is increased, and hence the electron carrier concentration can be increased; however, a high temperature heat treatment is disadvantageous. In addition, it is difficult to accurately control the carrier concentration.

As described above, for example, by the film formation performed in a gas containing hydrogen or by the ion implantation performed after the film formation, the electron carrier concentration is controlled by the hydrogen concentration in an amorphous oxide film. Accordingly, a semi-insulating amorphous oxide film having an electron carrier concentration of $10^{14}$ to $10^{18}$/cm$^3$ can be reproducibly obtained. When an amorphous oxide containing hydrogen as described above is applied to the channel layer of a thin film transistor, a transistor having a small hysteresis can be reproducibly formed.

In the transistor according to the present invention, as a material for the gate insulating film 12, any material may be used as long as having superior insulating properties. For example, as the gate insulating film 12, $Al_2O_3$, $Y_2O_3$, $HfO_2$, or a mixed compound containing at least two compounds mentioned above may be used. As a result, the leak current between the source and the drain electrodes and that between the drain and the gate electrodes can be decreased to approximately $10^{-7}$ A.

In addition, as materials for the source electrode 13, the drain electrode 14, and the gate electrode 15, any material may be used as long as having good electrical conductivity and being electrical connectable to the channel layer. For example, a transparent conductive film made of $In_2O_3$:Sn, ZnO or the like or a metal film made of Au, Pt, Al, Ni or the like may be used.

As the substrate 10, for example, a glass substrate, a plastic substrate, or a plastic film may be used.

Since the channel layer and the gate insulating film described above are transparent to visible light, when a transparent material is used as the materials for the above electrodes and substrate, a transparent thin film transistor can be formed.

Heretofore, although the amorphous oxide containing In—Ga—Zn has been described by way of example, an amorphous oxide containing at least one of Sn, In, and Zn may also be applied to the channel layer of the present invention.

Furthermore, when Sn is selected as at least one of constituent elements of the amorphous oxide, Sn may be replaced with $Sn_{1-x}M4_x$ (where $0<x<1$ holds, and M4 is an element (Si, Ge, or Zr) of Group IV having a smaller atomic number than that of Sn).

In addition, when In is selected as at least one of constituent elements of the amorphous oxide, In may be replaced with $In_{1-y}M3_y$ (where $0<y<1$ holds, and M3 is Lu or an element (B, Al, Ga, or Y) of Group III having a smaller atomic number than that of In).

In addition, when Zn is selected as at least one of constituent elements of the amorphous oxide, Zn may be replaced with $Zn_{1-z}M2_z$ (where $0<z<1$ holds, and M2 is an element (Mg or Ca) of Group II having a smaller atomic number than that of Zn).

As amorphous oxides which are applicable to the present invention, for example, there may be mentioned a Ga—In—Zn oxide, Sn—In—Zn oxide, In—Zn—Ga—Mg oxide, In oxide, In—Sn oxide, In—Ga oxide, In—Zn oxide, and Zn—Ga oxide. Of course, the composition ratio between the constituent elements is not always required to be 1 to 1. In addition, it may be difficult to form an amorphous phase only by Zn or Sn itself; however, when In is contained, an amorphous phase may be easily formed. For example, in the case of an IN—Zn-based system, amorphous films are formed under a composition containing approximately 20-70 atomic percentage of In for the metallic element. In the case of a Sn—In-based system, amorphous films are formed under a composition containing approximately 20-80 atomic percentage of In for the metallic element. In the case of a Sn—In—Zn-based system, amorphous films are formed under a composition containing approximately 15 atomic percentage or more of In for the metallic element.

In addition, the amorphous phase can be confirmed since no clear diffraction peaks are detected (that is, a hallow pattern is observed) when x-ray diffraction measurement is performed for a thin film at a low incident angle of approximately 0.5°. In the present invention, when the material described above is used for the channel layer of a field effect transistor, the channel layer may also contain a fine crystalline.

In addition, another embodiment of the present invention relates to a method for manufacturing an amorphous oxide film used for the channel layer of a field effect transistor; the method comprises the following first and second steps.

The first step is a step of disposing a substrate in a film-forming apparatus.

The second step is a step of forming an amorphous oxide film on the substrate while a gas containing hydrogen atoms (except water vapor) and an oxygen gas are supplied in the film-forming apparatus at respective predetermined partial pressures.

As previously described with reference to FIG. 4, when it is intended to control the electrical conductivity and the carrier concentration only by the oxygen partial pressure, the electrical conductivity must be controlled in the narrow region in which the conductivity steeply changes depending on the oxygen partial pressure.

When a gas containing hydrogen atoms, such as hydrogen, is used as in the case of this invention, for example, the oxygen partial pressure is set to 0.008 Pa or more and preferably set to 0.01 Pa or more. The conductivity of the amorphous oxide films can be controlled by adjusting the partial pressure of the gas containing hydrogen atoms.

In the range described above by way of example, the oxygen partial pressure dependence of the carrier concentration is not so high, for example, as compared to that in the region at an oxygen partial pressure of approximately 0.005 Pa.

The carrier concentration can also be adjusted by hydrogen partial pressure, and in addition, since the hydrogen partial pressure dependence of the carrier concentration is low as compared to the oxygen partial pressure dependence thereof, as a result, the controllability of the film-forming atmosphere can be improved.

The upper limit of the oxygen partial pressure is, for example, 0.1 Pa. The upper limit may be optionally set in the range of 0.05 to 0.5 Pa.

Although the preferable hydrogen partial pressure also depends on the oxygen partial pressure, it is, for example, in the range of 0.001 to 0.01 Pa.

In addition, water vapor is not preferably used since the control of the partial pressures of oxygen and hydrogen may become difficult in some cases.

It is not always necessary that hydrogen is contained in the oxide film during a film-forming step. Hydrogen may be contained in the oxide film by addition of hydrogen in a step performed after the film formation.

As a particular hydrogen addition method, for example, ion implantation or plasma treatment containing hydrogen may be mentioned.

Example 1

In this example, a top gate TFT shown in FIG. 1A was formed. In this example, the channel layer was an IN—Ga—Zn—O-based amorphous oxide formed by a sputtering method in a hydrogen-containing atmosphere.

First, on a glass substrate (Corning #1737 glass manufactured by Corning Incorporated), an amorphous oxide film containing hydrogen was formed as the channel layer.

In this example, an IN—Ga—Zn—O-based amorphous oxide film containing hydrogen was formed by high-frequency sputtering in a mixed gas atmosphere containing an argon, an oxygen, and a hydrogen gas.

Figure 5:
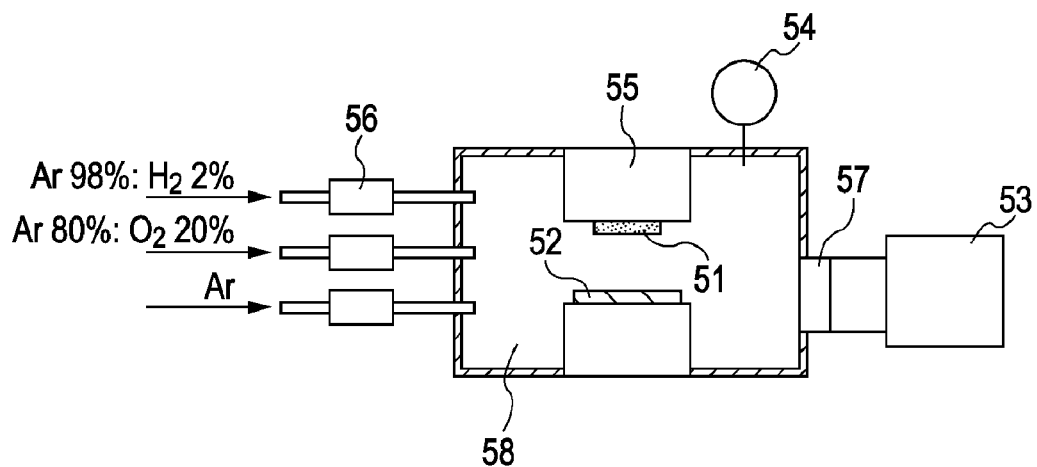
FIG. 5 is a schematic view of a manufacturing apparatus of an amorphous oxide film.

A sputtering apparatus as shown in FIG. 5 was used. In this figure, reference numeral 51 indicates a sample, reference numeral 52 a target, reference numeral 53 a vacuum pump, reference numeral 54 a vacuum gauge, reference numeral 55 a substrate holder, reference numeral 56 gas flow-rate controller provided for each gas introduction system, reference numeral 57 a pressure controller, and reference numeral 58 a film-forming chamber.

The vacuum pump 53 was used to evacuate the inside of the film-forming chamber 58. The substrate holder 55 was used to hold the substrate inside the film-forming chamber 58; the oxide film was formed on the substrate. The material source (the target) 52 was disposed to face the substrate holder 55. Furthermore, in the sputtering film-forming apparatus, there were provided an energy source (high-frequency electrical source, not shown) evaporating a material of the material source, means for supplying a hydrogen gas into the film-forming chamber 58, and means for supplying an oxygen gas into the film-forming chamber 58.

As the gas introduction system, there were provided 3 lines for argon, a mixed gas of argon and oxygen (Ar:$O_2$=80:20), and a mixed gas of argon and hydrogen (Ar:$H_2$=98:2). By the gas flow-rate controllers 56 independently controlling the respective gas flow rates and the pressure controller 57 controlling the pumping speed, a predetermined gas atmosphere could be obtained in the film-forming chamber 58.

In this example, although the mixed gas of argon and oxygen and the mixed gas of argon and hydrogen were used, pure hydrogen and pure oxygen may also be used. In addition, in this example, the gas introduction was performed by the 3 lines for argon, the mixed gas of argon and oxygen, and the mixed gas of argon and hydrogen; however, the gas introduction may be performed by one line for a mixed gas of argon, oxygen and hydrogen or by 2 lines for a mixed gas of argon and oxygen and a mixed gas of argon and hydrogen.

In this example, as the target (material source), a 2-inch polycrystalline sintered material of InGaO$_3$(ZnO) was used, and an input RF power was set to 100 W. In the film-forming atmosphere, the total pressure was set to 0.4 Pa, and as the gas flow-rate ratio, Ar:$O_2$:$H_2$=100:4:1 was satisfied. The deposition rate was 12 nm/min. In addition, the substrate temperature was unheated and kept around room temperature of 25° C.

When the film thus formed was evaluated by grazing incidence x-ray diffraction (thin film method, incident angle of 0.5°), no clear diffraction peaks were observed, and hence it was understood that the IN—Zn—Ga—O-based film thus formed was an amorphous film.

Furthermore, spectroellipsometric measurement and analysis shows that the mean square roughness (Rrms) of the thin film was approximately 0.5 nm, and the film thickness was approximately 60 nm. According to the result by a fluorescent x-ray (XRF) analysis, the metal composition ratio of the thin film was In:Ga:Zn=39:37:24.

In addition, by a composition analysis using SIMS, the hydrogen concentration in the thin film was estimated to be $4 \times 10^{18}$ (1/cm$^3$).

In addition, the electrical conductivity was approximately $10^{-1}$ S/cm, and the electron carrier concentration and the electron mobility were estimated to be approximately $4 \times 10^{16}$/cm$^3$ and 2 cm$^2$/V·sec, respectively. In addition, from a light absorption spectrometric analysis, it was estimated that the energy band gap of the amorphous oxide film thus formed was approximately 3 eV.

Next, by a photolithographic method and a lift-off method, the drain electrode 14 and the source electrode 13 were formed by patterning. The respective electrode materials were Au, and the thickness thereof was 30 nm.

Next, by a photolithographic method and a lift-off method, the gate insulating film 12 was formed by patterning. For the gate insulating film, an Y$_2$O$_3$ film having a thickness of 150 nm was formed by an electron beam deposition method. In addition, the relative dielectric constant of the Y$_2$O$_3$ film was approximately 15.

Furthermore, by a photolithographic method and a lift-off method, the gate electrode 15 was formed. The channel length and the channel width were 50 μm and 200 μm, respectively. The electrode material was Au, and the thickness was 30 nm.

Comparative Example 1

When the channel layer is formed, hydrogen was not supplied, and argon and oxygen were only supplied, so that a TFT was formed. In the film-forming atmosphere, the total pressure was 0.4 Pa, and as the gas flow rate ratio in this case, Ar to $O_2$ was set to 100 to 1, so that the oxygen partial pressure was 0.004 Pa. The film-forming rate was 14 nm/min. In addition, the substrate temperature was unheated and kept around room temperature of 25° C.

FIG. 4 is a graph showing the change in electrical conductivity of an amorphous oxide thin film as described above, which was obtained when the oxygen partial pressure was changed. As shown in the figure, in the range of the oxygen partial pressure used for TFT formation, the electrical conductivity is remarkably changed with a slight change in oxygen partial pressure; hence, the oxygen partial pressure must be accurately controlled.

(Property Evaluation of TFT)

FIGS. 2A and 2B are graphs each showing the current-voltage properties of a TFT, which were measured at room temperature. FIG. 2A shows the Id-Vd properties, and FIG. 2B shows the Id-Vg properties. As shown in FIG. 2A, when the drain voltage Vd dependence of the current Id between the source and the drain electrodes was measured while a constant gate voltage Vg was applied, typical semiconductor transistor behavior was shown in which the Id was saturated (pinch-off) at a drain voltage Vd of approximately 6 V. When the transfer characteristics were measured, the threshold value of the gate voltage $V_G$ at a drain voltage Vd of 4 V was approximately −0.5 V. In addition, when the gate voltage Vg was 10 V, a current Id of approximately $1.0 \times 10^{-5}$ A flowed.

The ON/OFF ratio of the transistor was more than $10^6$. In addition, when the electron filed-effect mobility was calculated from the output properties, a field-effect mobility of approximately 8 cm$^2$ (Vs)$^{-1}$ was obtained in the saturated region. The device thus formed was irradiated with visible light and was measured in a manner similar to that described above; however, the change in transistor properties was not observed at all.

In addition, the hysteresis of the TFT of this example was smaller than that of the TFT of the comparative example. FIGS. 3A and 3B are graphs showing the Id-Vg relationships of the comparative example and this example, respectively. The Id-Vg relationship was one of the TFT properties. As shown in the figures, by addition of hydrogen to the channel layer, the hysteresis of the TFT can be reduced.

In addition, compared to the case of the comparative example, the TFT can be reproducibly formed in this example, and the variation in properties of the devices thus formed tends to decrease. It is believed that since the film formation can be performed at a high oxygen partial pressure in this example as compared to that of the comparative example, the TFT can be reproducibly formed. In addition, it is also believed that since the channel layer can be formed in a hydrogen-containing atmosphere, the change in TFT properties with a slight change in oxygen partial pressure is decreased, and hence the variation in properties is decreased.

The oxygen partial pressure was actually about 5 mPa in the comparative example and was approximately 0.015 Pa in this example. As shown in FIG. 4, in the comparative example, the oxygen partial pressure is controlled without addition of hydrogen in a sputtering method. Then, a thin film is formed having an electron carrier concentration which is suitable for the TFT channel layer. Hence, the oxygen partial pressure must be set to a pressure of approximately 5 mPa. As described above, since the carrier concentration is sensitively changed with the change of the oxygen partial pressure under this condition, the properties are remarkably influenced by a slight change in film-forming condition, and as a result, it tends to be difficult to reproducibly obtain superior TFT properties.

On the other hand, in this example, the electron carrier concentration is controlled by addition of hydrogen. In this example, besides the addition of hydrogen, a pressure of 0.01 Pa or more is used as the oxygen partial pressure. As shown in FIG. 4, the film formed at this oxygen partial pressure (>0.01 Pa) without adding hydrogen is an insulating material, and hence the electron deficiency and the electron carrier concentration are sufficiently decreased. In this example, the film is formed in a hydrogen-containing atmosphere at a relatively high oxygen partial pressure. By the method described above, the properties are not remarkably influenced by a slight change in oxygen partial pressure, and hence a desired electron carrier concentration can be obtained. Accordingly, transistors with a small property variation can be reproducibly formed.

In addition, when the electron carrier concentration and electron mobility of amorphous oxide films containing hydrogen were measured, the amorphous oxide films being obtained at different hydrogen partial pressures in the film-forming atmosphere, as the hydrogen partial pressure is increased, the carrier concentration and the electron mobility tend to increase. The evaluation was performed by hole mobility measurement.

In a general compound, as the carrier concentration is increased, the electron mobility is decreased due to scattering between carriers and the like; however, in the amorphous oxide containing hydrogen of the present invention, as the electron carrier concentration is increased, the electron mobility is also increased. The physical mechanism of this phenomenon has not been well understood.

When a voltage is applied to the gate electrode, since electrons are injected in the above amorphous oxide channel layer, current flows between the source and the drain electrodes, so that the region therebetween is put in an ON state. In the amorphous oxide film of the present invention, since the electron mobility is increased as the electron carrier concentration is increased, the current can be further increased when the transistor is placed in an ON state. That is, the saturated current and the ON/OFF ratio can be further increased.

It is expected that the field effect transistor of the present invention having a relatively high field-effect mobility is applied, for example, to operational circuits of organic light-emitting diodes.

Example 2

In this example, an amorphous oxide film containing hydrogen will be described which is to be used for a channel layer of a thin-film transistor. First, an insulating thin film of an amorphous oxide was formed on a quartz substrate.

A film-forming method of the amorphous oxide was performed in accordance with that described in Example 1. The target (material source) was $InGaO_3(ZnO)$, and the total pressure in an atmosphere during film formation was 0.3 Pa. In this step, the gas flow rate ratio was set to $Ar:O_2=95:5$, and hence the oxygen partial pressure corresponded to 0.015 Pa. In addition, a hydrogen gas was not supplied. The film thickness was set to approximately 400 nm. When the resistance of the thin film thus formed was measured by a four probe method, the conductivity was not more than the measurement limit (0.0001 S/cm or less), and hence it was confirmed that the thin film was an insulating film.

Next, hydrogen ion implantation was performed for the above amorphous oxide thin film. In this ion implantation, H+ (proton) was used as an ion species, and the accelerating voltage was 20 kV. Samples having various irradiation amounts per area in the range of $1\times10^{12}$ to $1\times10^{16}$ $(1/cm^2)$ were prepared.

Figure 7:
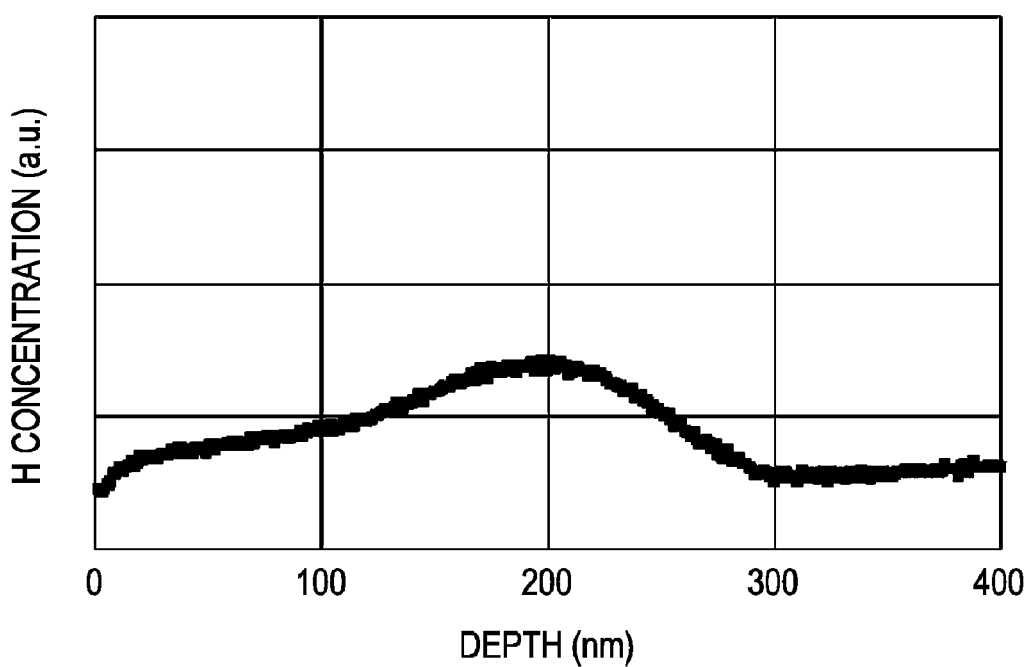
FIG. 7 is a graph showing the profile of a hydrogen concentration in the depth direction measured by SIMS.

The composition analysis in the depth direction by SIMS was performed for a sample irradiated with hydrogen ions in an amount of $1\times10^{16}$ $(1/cm^2)$, and the result is shown in FIG. 7. The vertical axis (arbitrary axis) indicates the hydrogen concentration and the horizontal axis indicates the depth. As a result, a depth profile was obtained having a peak at approximately 200 nm deep from the surface. In addition, the hydrogen concentration in the thin film was approximately $2\times10^{20}$ $(1/cm^3)$.

For example, as for a sample having an irradiation amount per area of $1\times10^{13}$ $(1/cm^2)$, since the hydrogen concentration thereof is not more than the detection limit of SIMS, quantitative measurement cannot be performed; however, by the use of the above result, the hydrogen concentration can be estimated to be approximately $2\times10^{17}$ $(1/cm^3)$.

Figure 6:
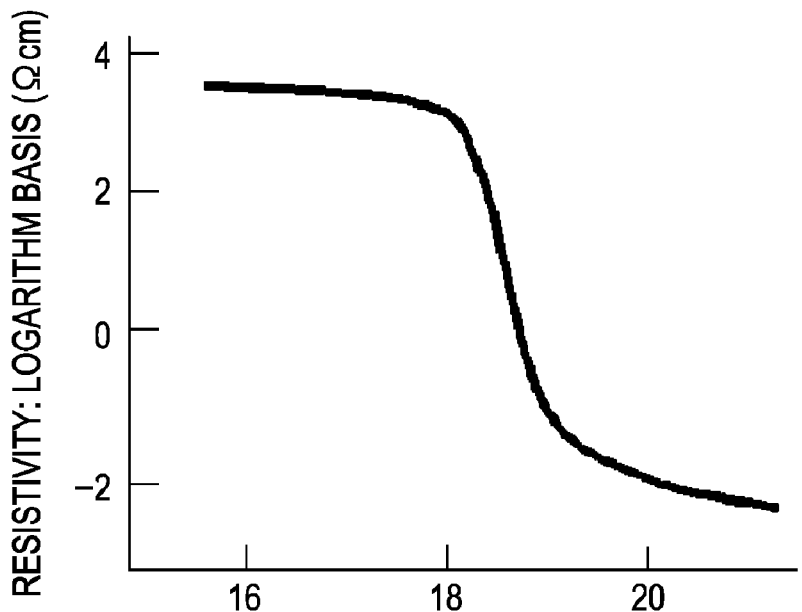
FIG. 6 is a graph showing the relationship between the resistivity and the amount of hydrogen implanted in an In—Ga—Zn—O-based amorphous oxide film.

FIG. 6 is a graph showing the relationship between the resistivity and the amount of hydrogen ions implanted in an amorphous InGaZnO thin film. In this graph, the horizontal axis indicates the amount of implanted hydrogen ions estimated by the method described above, and the vertical axis indicates the resistivity on a logarithm basis. As described above, it is understood that the electrical conductivity can be controlled by addition of hydrogen to an amorphous oxide film. In particular, it is understood that at a hydrogen concentration of approximately $10^{18}$ $(1/cm^3)$, the electrical conductivity is significantly changed. That is, when hydrogen is implanted in an insulating IN—Ga—Zn oxide to have a concentration of approximately $10^{18}$ $(1/cm^3)$, a semiconductor material can be obtained.

When the hole mobility of a sample implanted with hydrogen ions in an amount per area of $1\times10^{15}$ $(1/cm^2)$ was evaluated, the polarity of carriers was negative, the hole mobility was 9 $cm^2/V \cdot sec$, and the carrier concentration was $6\times10^{18}$ $(1/cm^3)$.

As described above, when an amorphous oxide semiconductor is applied to an active layer of a thin-film transistor, it is preferable from an experience point of view that a semiconductor oxide film be formed which has an electrical conductivity of 0.0001 to 0.1 S/cm. Hence, it is understood that in the formation method of this example, the amount of implanted hydrogen ions is preferably set to approximately $10^{18}$ (1/cm$^3$).

In the method using ion implantation, according to this example, the hydrogen content and the carrier concentration can be precisely controlled by the ion irradiation amount (irradiation time). Hence, when this method is applied to the formation of a thin-film transistor, the resistivity and the carrier concentration of the channel layer can be precisely controlled, and as a result, an advantage can be obtained in that devices can be reproducibly formed.

Example 3

In this example, a top gate TFT shown in FIG. 1A was formed. In this case, a channel layer of an amorphous oxide containing hydrogen (or deuterium) was formed by ion implantation of hydrogen or deuterium in an IN—Ga—Zn—O-based amorphous oxide formed by a pulse laser deposition method (PLD method).

First, on a glass substrate (Corning #1737 glass manufactured by Corning Incorporated), an IN—Zn—Ga—O-based amorphous oxide film was formed by the PLD method.

A polycrystalline sintered material of InGaO$_3$(ZnO)$_4$ was used as the target, and an IN—Zn—Ga—O-based amorphous oxide film was deposited. The oxygen partial pressure was 7 Pa during the film formation. The power of a KrF excimer laser was $1.5 \times 10^{-3}$ mJ/cm$^2$/pulse, the pulse width was 20 nsec, and the repeated frequency was 10 Hz. In addition, the substrate temperature was unheated and kept around room temperature of 25° C.

According to the results of a fluorescent x-ray (XRF) analysis, as the metal composition ratio of the thin film, In:Ga:Zn=0.97:1.01:4 was satisfied. Furthermore, according to the results of a pattern analysis by a spectroellipsometric measurement, the mean square roughness (Rrms) was approximately 0.6 nm, and the film thickness was approximately 100 nm. In addition, the electrical conductivity was $10^{-3}$ S/cm or less (lower measurement limit or less), and hence the thin film was an insulating film.

Next, hydrogen (or deuterium) ions were implanted in the amorphous oxide thin film.

As the ion species, H$^+$ (proton) was used, and the acceleration voltage was 10 kV. Samples having various irradiation amounts in the range of $1 \times 10^{11}$ to $1 \times 10^{15}$ (1/cm$^2$) were prepared. In addition, samples which were ion-implanted with deuterium D$^+$ were also prepared. When the composition analysis by SIMS was performed for the evaluation of the hydrogen concentration, a sample irradiated with an ion amount of $2 \times 10^{14}$ (1/cm$^2$) had a hydrogen concentration of approximately $1 \times 10^{19}$ (1/cm$^3$). Accordingly, for example, since the hydrogen concentration of a sample irradiated with an ion amount of $2 \times 10^{12}$ (1/cm$^2$) is less than the detection limit, the measurement cannot be performed; however, the hydrogen concentration can be estimated to be approximately $1 \times 10^{17}$ (1/cm$^3$).

When the film thus formed was evaluated by grazing incidence x-ray diffraction (thin film method, incident angle of 0.5°), no clear diffraction peaks were observed, and hence it was understood that the IN—Zn—Ga—O-based film thus formed was an amorphous film.

In the following thin film transistor of this example, an amorphous oxide irradiated with an ion amount of $2 \times 10^{13}$ (1/cm$^2$) was used. The hydrogen concentration is estimated to be approximately $1 \times 10^{18}$ (1/cm$^3$). In addition, the film was a semi-insulating film having an electrical conductivity of approximately $10^{-2}$ S/cm.

By a photolithographic method and a lift-off method, the drain electrode 14 and the source electrode 13 were formed by patterning. The respective electrode materials were Au, and the thickness thereof was 30 nm.

Next, by a photolithographic method and a lift-off method, the gate insulating film 12 was formed by patterning. For the gate insulating film, a HfO$_2$ film having a thickness of 150 nm was formed by a laser deposition method.

Furthermore, by a photolithographic method and a lift-off method, the gate electrode 15 was formed. The electrode material was Au, and the thickness was set to 50 nm. The channel length and the channel width were 50 µm and 200 µm, respectively.

Comparative Example 2

A top gate TFT shown in FIG. 1A was formed in a manner similar to that in Example 2 except for the formation of the channel layer. The channel layer was formed by a PLD method at an oxidation partial pressure of 6 Pa. In addition, ion implantation of hydrogen and deuterium was not performed. Since the oxygen partial pressure is lower than that in the example, a semi-insulating amorphous oxide film was formed because of the oxygen deficiency.

(Property Evaluation of TFT)

The thin film transistor of this example showed typical semiconductor transistor behavior in which saturation (pinch-off) occurred at a voltage Vd of approximately 6 V. The ON/OFF ratio of the transistor was more than $10^6$, and the field-effect mobility was approximately 7 cm$^2$ (Vs)$^{-1}$. Between the case in which hydrogen was ion implanted and the case in which deuterium was ion implanted, no significant different could be observed.

In addition, the TFT of Example 2 had a small hysteresis as compared to that of the TFT of Comparative Example 2. In addition, the variation in properties in Example 2 when a plurality of devices is formed tends to be small as compared to that in Comparative Example 2. It is construed that TFTs can be reproducibly formed in this example since the film formation is performed at a higher oxygen partial pressure than that in the comparative example. In addition, it is believed that since the TFT properties are hardly changed with a slight change in oxygen partial pressure during the channel layer formation, the variation in properties among TFTs is decreased.

In addition, when the hydrogen concentration in the channel layer is low, the effect of reducing the hysteresis tends to decrease, and when the hydrogen concentration is high, the ON/OFF ratio tends to decrease. Hence, the hydrogen concentration is preferably set in the range of $10^{17}$ to $10^{19}$ (1/cm$^3$). When the electron carrier concentration and the electron mobility of an amorphous oxide film containing hydrogen were evaluated by changing the amount of implanted hydrogen ions, it was found that the carrier concentration and the electron mobility both tend to increase concomitant with the increase in amount of implanted hydrogen.

In a general compound, as the carrier concentration is increased, the electron mobility is decreased because of scattering between carriers and the like; however, in the amorphous oxide containing hydrogen used in the present invention, with the increase in electron carrier concentration, the electron mobility is increased. However, the physical mechanism thereof has not been well understood.

When a voltage is applied to the gate electrode, since electrons are injected in the above amorphous oxide channel layer, current flows between the source and the drain electrodes, so that the region therebetween is put in an ON state. In the amorphous oxide film of the present invention, since the electron mobility is increased as the electron carrier concentration is increased, the current can be further increased when the transistor is placed in an ON state. That is, the saturated current and the ON/OFF ratio can be further increased.

It is expected that the field effect transistor of the present invention having a relatively high field-effect mobility is applied, for example, to operational circuits of organic light-emitting diodes.

Example 4

In this example, a bottom gate TFT shown in FIG. 1B was formed.

First, a gate electrode of Ta having a thickness of 200 nm was formed by sputtering on a glass substrate. The patterning was performed by a photolithographic method and a dry etching method.

Next, by a plasma CVD method, an insulating film of a-SiN having a thickness of 250 nm was formed.

Subsequently, a channel layer of an amorphous oxide containing hydrogen was formed. In this example, the method for forming a channel layer was performed in accordance with that of Example 1. However, as the target, a 2-inch polycrystalline sintered material of $In_2O_3(SnO_2)$ was used, and an input RF power was set to 100 W. In the film-forming atmosphere, the total pressure was 0.4 Pa, and as the gas flow ratio for the film formation, $Ar:O_2:H_2=100:10:1$ was satisfied. The film-forming rate was 11 nm/min. In addition, the substrate temperature was unheated and kept around room temperature of 25° C.

When the film thus formed was evaluated by grazing incidence x-ray diffraction (thin film method, incident angle of 0.5°), no clear diffraction peaks were observed, and hence it was understood that the IN—Sn—O-based film thus formed was an amorphous film. In addition, according to the results of a fluorescent x-ray (XRF) analysis, as the metal composition ratio, the metal ratio of In to Sn was 0.95 to 1.

(Property Evaluation of TFT)

The thin film transistor of this example showed a small hysteresis, and when a plurality of devices is formed, variation in properties tends to be small. In addition, the ON/OFF ratio of the transistor was more than $10^6$, and the field-effect mobility was approximately 9 cm² $(Vs)^{-1}$.

Example 5

In this example, on a plastic substrate, a top gate TFT shown in FIG. 1A was formed. The manufacturing method and the structure were similar to those in Example 1.

However, as the substrate, a polyethylene terephthalate (PET) film was used.

In addition, in this example, as the target for forming the channel layer, a 2-inch polycrystalline sintered material of $In_2O_3 \cdot ZnO$ was used, and an input RF power was set to 100 W. In the film-forming atmosphere, the total pressure was 0.4 Pa, and as the gas flow ratio for the film formation, $Ar:O_2:H_2=100:6:1$ was satisfied. The film-forming rate was 12 nm/min. In addition, the substrate temperature was unheated and kept around room temperature of 25° C.

When the film thus formed was evaluated by grazing incidence x-ray diffraction (thin film method, incident angle of 0.5°), no clear diffraction peaks were observed, and hence it was understood that the IN—Zn—O-based film thus formed was an amorphous film. In addition, according to the results of a fluorescent x-ray (XRF) analysis, as the metal composition ratio, the metal ratio of In to Zn was 1.1 to 0.9.

In addition, the source electrode, the drain electrode, and the gate electrode were made of a transparent conductive film of $In_2O_3:Sn$. The thickness of the electrode was 100 nm.

(Property Evaluation of TFT)

The thin film transistor formed on the PET film was measured at room temperature. The ON/OFF ratio of the transistor was more than $10^3$. In addition, when the field-effect mobility was calculated, it was approximately 3 cm² $(Vs)^{-1}$.

After the device formed on the PET film was bent to have a curvature radius of 30 mm, although the transistor properties as described above were also evaluated, a significant change in transistor properties was not observed. In addition, although irradiation of visible light was performed and the measurement as described above was performed, the change in transistor properties was not observed.

The thin film transistor formed in this example was transparent to visible light and was formed on a flexible substrate.

According to the field effect transistor of the present invention, since film formation can be performed at a low temperature, and a film formed thereby is amorphous, the above field effect transistor can be formed on a flexible material such as a PET film. That is, switching can be performed while this transistor is being bent, and the transistor is transparent to visible and infrared light having a wavelength of 400 nm or more (in this case, the transistor is not required to have a light transmission of 100% but may be required to be practically transparent).

Hence, the field effect transistor may be used as a switching device of LCD and/or organic EL display devices. In addition, the field effect transistor of the present invention may also be widely used, for example, for see-through displays, IC cards, and ID tags besides flexible displays.

According to the present invention, since the amorphous oxide containing hydrogen (or deuterium) is applied to the channel layer of a field effect transistor, a thin film field effect transistor having a small hysteresis can be realized.

According to the manufacturing method of the present invention, since the film formation is performed in an atmosphere containing a hydrogen gas and an oxygen gas, the carrier concentration of an amorphous oxide can be highly accurately controlled.

In addition, in the manufacturing method of the present invention, a low temperature process can be performed, and hence the field effect transistor can be formed on a substrate such as a plastic plate or film.

Furthermore, according to the manufacturing apparatus of the present invention, the field effect transistor can be reproducibly formed. In particular, by using the manufacturing apparatus of the present invention, the amorphous oxide having a low electron carrier concentration can be formed with good control.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims the benefit of Japanese Patent Application Nos. 2005-258263, filed Sep. 6, 2005, and 2006-221552, filed Aug. 15, 2006, which are hereby incorporated by reference herein in their entirety.

The invention claimed is:

1. A method for manufacturing an amorphous oxide film which contains In or Zn and which is used as a channel layer of a field effect transistor, the amorphous oxide film showing an electron carrier concentration and an electron mobility such that the electron mobility tends to increase as the electron carrier concentration increases, the method comprising the steps of:
   disposing a substrate in a film-forming apparatus; and
   forming the amorphous oxide film on the substrate by a sputtering method while a hydrogen gas and an oxygen gas are introduced in the film-forming apparatus at respective partial pressures of 0.001 to 0.01 Pa and 0.008 to 0.5 Pa, whereby the amorphous oxide film contains hydrogen at a concentration of $10^{16}/cm^3$ to $10^{20}/cm^3$.

2. A method for manufacturing a field effect transistor, comprising the steps of:
   forming a gate electrode;
   forming a gate insulating layer;
   forming a source electrode and a drain electrode; and
   forming a channel layer of an amorphous oxide by a sputtering method while a hydrogen gas and an oxygen gas are introduced in a film-forming apparatus at respective partial pressures of 0.001 to 0.01 Pa and 0.008 to 0.5 Pa, whereby the amorphous oxide film contains hydrogen at a concentration of $10^{16}/cm^3$ to $10^{20}/cm^3$, the channel layer showing an electron carrier concentration and an electron mobility such that the electron mobility tends to increase as the electron carrier concentration increases.

3. The method for manufacturing a field effect transistor according to claim 2, further comprising the step of:
   increasing the amount of hydrogen contained in the channel layer formed of the amorphous oxide by ion implantation or plasma treatment in an atmosphere containing hydrogen.

4. A method for manufacturing an amorphous oxide film which contains In or Zn and which is used as a channel layer of a field effect transistor, the amorphous oxide film showing an electron carrier concentration and an electron mobility such that the electron mobility tends to increase as the electron carrier concentration increases, the method comprising the steps of:
   disposing a substrate in a film-forming apparatus;
   forming an amorphous oxide film on the substrate by a sputtering method; and
   introducing hydrogen into the amorphous oxide film, after formation thereof, by ion implantation or plasma treatment in an atmosphere containing hydrogen, whereby the amorphous oxide film contains hydrogen at a concentration of $10^{16}/cm^3$ to $10^{20}/cm^3$.

* * * * *